United States Patent
Tan et al.

(10) Patent No.: US 8,759,947 B2
(45) Date of Patent: Jun. 24, 2014

(54) BACK-SIDE MOM/MIM DEVICES

(75) Inventors: Juan Boon Tan, Singapore (SG); Yeow Kheng Lim, Singapore (SG); Shao Ning Yuan, Singapore (SG); Soh Yun Siah, Singapore (SG); Shunqiang Gong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 84 days.

(21) Appl. No.: 13/430,778

(22) Filed: Mar. 27, 2012

(65) Prior Publication Data
US 2013/0256834 A1 Oct. 3, 2013

(51) Int. Cl.
*H01L 21/02* (2006.01)

(52) U.S. Cl.
USPC ........................................................ 257/532

(58) Field of Classification Search
USPC ................ 257/532, 678–733, 296–313, 533, 257/595–602, 923–924, E27.016–E27.017, 257/E27.019–E27.021, E27.023–E27.025, 257/E27.03–E27.035, E27.037–E27.038, 257/E27.041–E27.045, E27.047–E27.048, 257/E27.071, E27.09, E27.092, E27.093, 257/E27.095, E27.101, E27.114–E27.116, 257/E21.008–E21.21, E21.364; 438/15, 438/25–28, 51, 64–68, 107–127, 171, 190, 438/210, 238–253, 329, 379, 387, 444, 901
See application file for complete search history.

(56) References Cited

U.S. PATENT DOCUMENTS

| | | | | |
|---|---|---|---|---|
| 6,304,425 B1 * | 10/2001 | Mamada | ..................... | 361/321.2 |
| 6,577,490 B2 * | 6/2003 | Ogawa et al. | .............. | 361/306.1 |
| 7,041,569 B1 * | 5/2006 | Kar-Roy et al. | .............. | 438/396 |
| 8,110,750 B2 * | 2/2012 | Inagaki et al. | ................ | 174/260 |
| 2004/0184219 A1 * | 9/2004 | Otsuka et al. | ................ | 361/306.3 |
| 2005/0121744 A1 * | 6/2005 | Chang et al. | ................ | 257/532 |
| 2007/0230090 A1 * | 10/2007 | Kumagai | ..................... | 361/328 |
| 2008/0185682 A1 * | 8/2008 | Alter | ............................. | 257/532 |
| 2009/0230507 A1 * | 9/2009 | Riess et al. | ..................... | 257/532 |
| 2011/0018099 A1 * | 1/2011 | Muramatsu | ................... | 257/532 |
| 2011/0086487 A1 * | 4/2011 | Baumgartner et al. | ........ | 438/381 |
| 2013/0093047 A1 * | 4/2013 | Huang et al. | .................. | 257/532 |

* cited by examiner

*Primary Examiner* — Dao H Nguyen
*Assistant Examiner* — Tram H Nguyen
(74) *Attorney, Agent, or Firm* — Ditthavong Mori & Steiner, P.C.

(57) ABSTRACT

Back-side MOM/MIM structures are integrated on a device with front-side circuitry. Embodiments include forming a substrate having a front side and a back side that is opposite the front side, the substrate including circuitry on the front side of the substrate; and forming a metal-oxide-metal (MOM) capacitor, a metal-insulator-metal (MIM) capacitor, or a combination thereof on the back side of the substrate. Other embodiments include forming a through-silicon via (TSV), in the substrate, connecting the MOM capacitor, the MIM capacitor, or a combination thereof to the circuitry on the front side of the substrate.

18 Claims, 4 Drawing Sheets

BACK-SIDE MOM/MIM DEVICES

TECHNICAL FIELD

The present disclosure relates to devices utilizing metal-oxide-metal (MOM) and/or metal-insulator-metal (MIM) capacitors (or circuitry). The present disclosure is particularly applicable to MOM/MIM devices in semiconductor manufacturing technology.

BACKGROUND

Typically, designers will increase the chip area for a MOM/MIM device layout to enable higher capacitance of the MIM/MOM device in their circuits or applications. The use of larger MOM/MIM layouts may, however, result in an overall increase in chip size and, thus, higher manufacturing costs. Although a thinner dielectric may alternatively be utilized in manufacturing MOM/MIM devices to enable higher capacitance, a potential issue of lower breakdown voltage and higher leakage associated with using a thinner dielectric may lead to an increase in overall circuit leakage and a reduction in terms of circuit performance and reliability.

A need therefore exists for back-side MOM/MIM devices, and enabling methodology.

SUMMARY

An aspect of the present disclosure is a method for fabricating a device with back-side MOM/MIM capacitors.

Another aspect of the present disclosure is a device with back-side MOM/MIM capacitors.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a substrate having a front side and a back side that is opposite the front side, the substrate including circuitry on the front side of the substrate; and forming a MOM capacitor, a MIM capacitor, or a combination thereof on the back side of the substrate.

Aspects of the present disclosure include forming a through-silicon via (TSV), in the substrate, connecting the MOM capacitor, the MIM capacitor, or a combination thereof to the circuitry on the front side of the substrate. In certain embodiments, the circuitry on the front side of the substrate may include a front-side MOM capacitor, a front-side MIM capacitor, or a combination thereof. Another aspect includes forming the MOM capacitor by forming a plurality of parallel fingers. In some embodiments, the parallel fingers may be formed, for instance, by forming a plurality of ultra thick metal (UTM) fingers. It is noted, however, that any other suitable materials (e.g., copper, aluminum, titanium, tantalum, etc.) may additionally, or alternatively, be utilized to form fingers of the MOM capacitor, as well.

Additional aspects include forming the MOM capacitor by: forming a first layer, including a first set of parallel fingers, on the back side of the substrate; and forming one or more other layers, including one or more other sets of parallel fingers, under the first layer on the back side of the substrate. Other aspects include forming the MOM capacitor by forming a layer including a first set of interconnected fingers and a second set of interconnected fingers, interlaced therewith. Further aspects of the present disclosure include forming the MIM capacitor by forming a first plate, a second plate, and a dielectric layer between the first plate and the second plate.

An additional aspect of the present disclosure is a device including: a substrate having a front side and a back side that is opposite the front side; circuitry on the front side of the substrate; and a MOM capacitor, a MIM capacitor, or a combination thereof on the back side of the substrate.

Aspects include a device having a TSV, in the substrate, connecting the MOM capacitor, the MIM capacitor, or a combination thereof to the circuitry on the front side of the substrate. In certain embodiments, the circuitry on the front side of the substrate may include a front-side MOM capacitor, a front-side MIM capacitor, or a combination thereof. Another aspect includes a device with the MOM capacitor that includes a plurality of parallel fingers. In some embodiments, the parallel fingers may, for instance, include a plurality of UTM fingers. It is noted, however, that the parallel fingers may include fingers formed by any other suitable materials.

Additional aspects include the MOM capacitor having a first layer, including a first set of parallel fingers, on the back side of the substrate; and one or more other layers, including one or more other sets of parallel fingers, under the first layer on the back side of the substrate. Other aspects include the MOM capacitor having a layer including a first set of interconnected fingers and a second set of interconnected fingers, interlaced therewith. Further aspects include the MIM capacitor having a first plate, a second plate, and a dielectric layer between the first plate and the second plate.

Another aspect of the present disclosure includes: forming a substrate having a front side and a back side that is opposite the front side; forming circuitry on the front side of the substrate; forming a TSV, in the substrate, electrically connected to the circuitry on the front side of the substrate; and forming a MOM capacitor, a MIM capacitor, or a combination thereof on the back side of the substrate, electrically connected to the TSV. In certain embodiments, the circuitry on the front side of the substrate may include a front-side MOM capacitor, a front-side MIM capacitor, or a combination thereof.

Further aspects include forming the MOM capacitor by forming at least one layer, each layer including a plurality of parallel fingers, on the back side of the substrate. Additional aspects include forming the MIM capacitor by forming a first plate, a second plate, and a dielectric layer between the first plate and the second plate. Other aspects include packaging the MOM capacitor, the MIM capacitor, or a combination thereof with other circuitry, devices, or a combination thereof using standard chip stack/package technology.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIG. 1 schematically illustrates a structure with a back-side MOM capacitor, in accordance with an embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of increasing chip size and higher manufacturing costs associated with a need for higher capacitance. The present disclosure addresses and solves such problems, for instance, by, inter alia, forming a substrate with circuitry on the front side of the substrate, forming a MOM capacitor, a MIM capacitor, or a combination thereof on the opposite side of the substrate, and connecting the MIM and/or MOM to the circuitry by one or more TSVs through the substrate.

Figure 1:
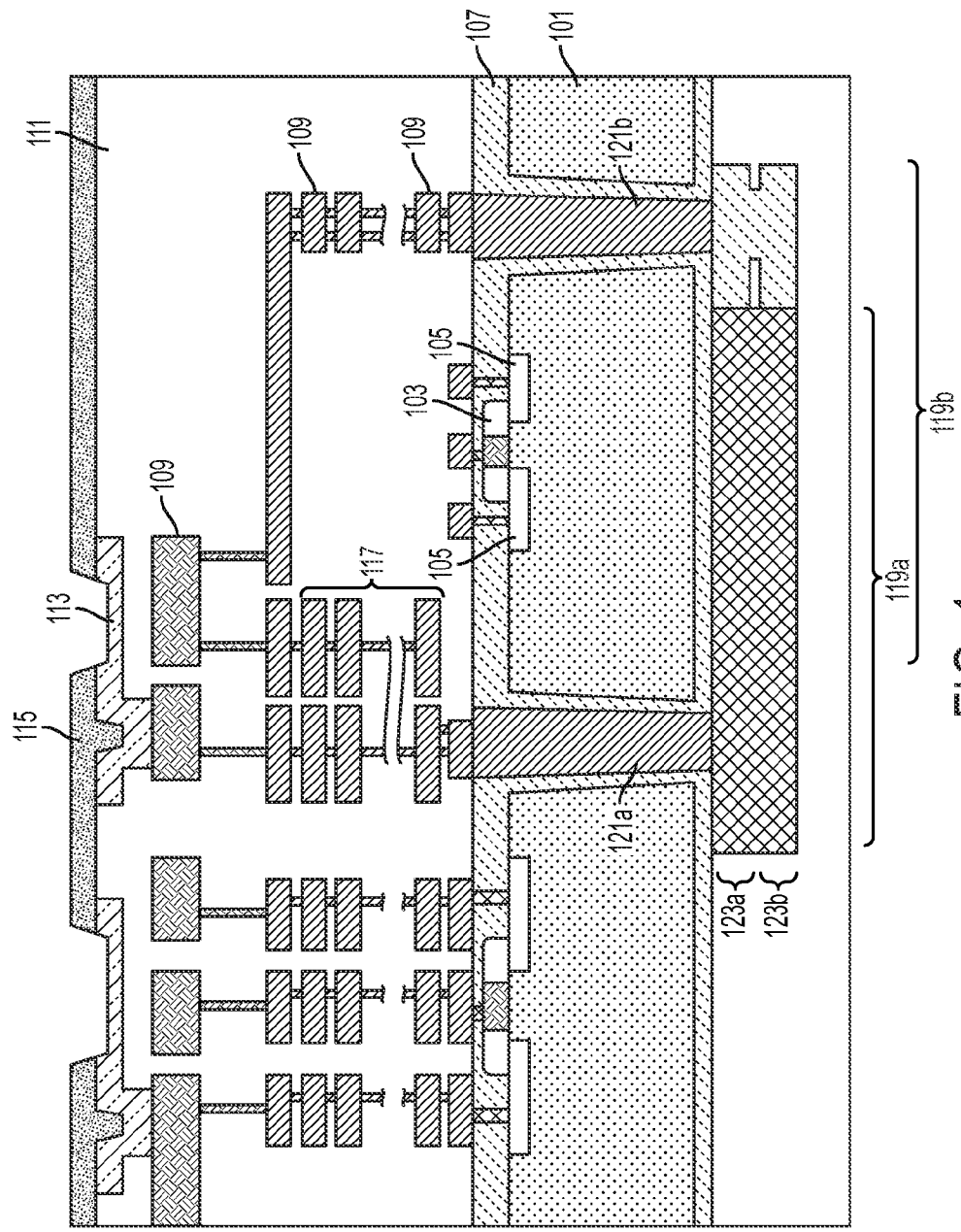

FIG. 1 schematically illustrates a structure with a back-side MOM capacitor, in accordance with an embodiment of the present disclosure. The structure shown in FIG. 1 includes substrate 101 with gate stack regions 103 and source/drain regions 105 on a front surface, which may, for instance, make up at least a part of the front side circuitry. An isolation dielectric 107 (e.g., tetraethylorthosilicate (TEOS) oxide) separates gate stack regions 103 and source/drain regions 105 from interconnect layers 109 (e.g., cooper, aluminum, etc.), which in turn are isolated from each other through inter-metal dielectric 111. Bond pads 113 (e.g., aluminum) and passivation layers 115 (e.g., oxide, nitride, etc.) top off the front side of the structure. As illustrated, the structure may also include a front-side MOM capacitor (or MOM circuitry, such as a combination stacked MOM capacitor) 117 and a back-side MOM capacitor 119 (e.g., which include portions 119a and 119b). Circuitry 117 and back-side MOM capacitor 119 are electrically connected by TSVs 121 (e.g., TSV 121a and 121b). Other TSVs (not shown for illustrative convenience) may be included that are not connected to the back-side MOM capacitor 119, for instance, for other purposes of chip packaging or stacking (e.g., connecting other circuitries). In some embodiments, the back-side MOM capacitor 119 may be electrically connected to other chips/circuits through 3D packaging for use by the other chips/circuits.

In addition, since there is more available back-side chip area that can be designated for back-side MOM capacitors, a larger capacitor may be formed without increasing the chip size. As shown, each layer of the back-side MOM capacitor 119 (e.g., layers 123a and 123b) may be several, tens, hundreds or more times greater (e.g., in length, width, thickness, etc.) than each of the layers of the front-side MOM capacitor 117. Backside MOM capacitor 119, thus, may enable improved breakdown voltage and leakage performance, resulting in overall circuit performance improvement. Furthermore, since the MOM capacitor 119 is on the back-side of the substrate 101, formation of the back-side MOM capacitor 119 may, for instance, be separated from other front-end-of-line (FEOL) and back-end-of-line (BEOL) processes.

Figure 2:
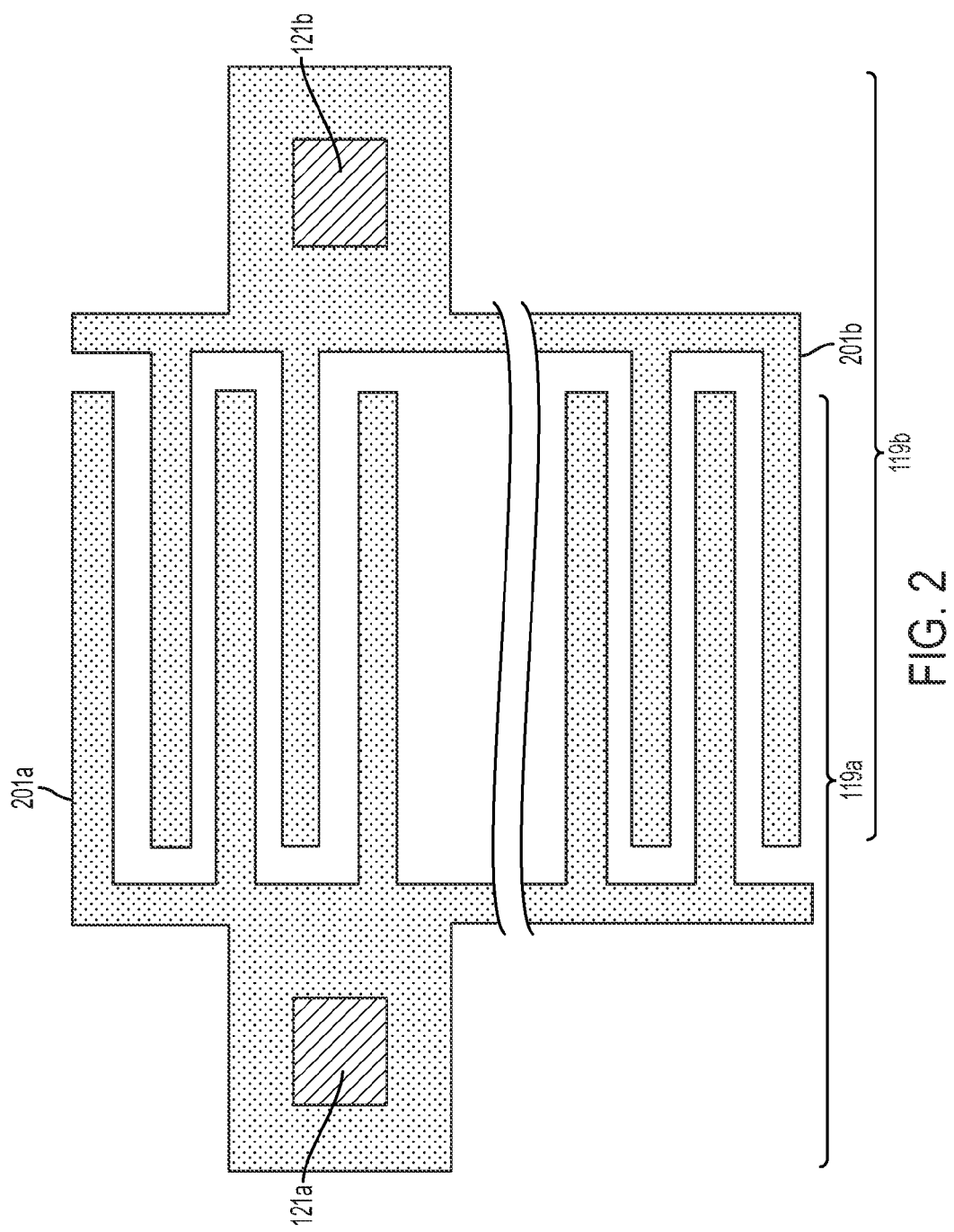
FIG. 2 schematically illustrates a top view of a back-side MOM capacitor, in accordance with an embodiment of the present disclosure.

FIG. 2 schematically illustrates a top view of a back-side MOM capacitor, in accordance with an embodiment of the present disclosure. As shown, the MOM capacitor 119 may, for instance, be connected to TSVs 121a and 121b. Portion 119a may include a set of fingers 201a and portion 119b may include another set of fingers 201b. As indicated, in certain embodiments, the fingers 201 may include UTM fingers. However, as noted, the fingers 201 may additionally, or alternatively, include fingers formed by any other suitable materials (e.g., copper, aluminum, titanium, tantalum, etc.). Further, the number of fingers shown is merely exemplary and will vary according to space, electrical requirements, optimizations, etc., for instance, of the structure including the MOM capacitor 119, as will the length, width, and thickness of the fingers 201 (and the layers of the MOM capacitor 119 that includes the fingers 201).

Figure 3:
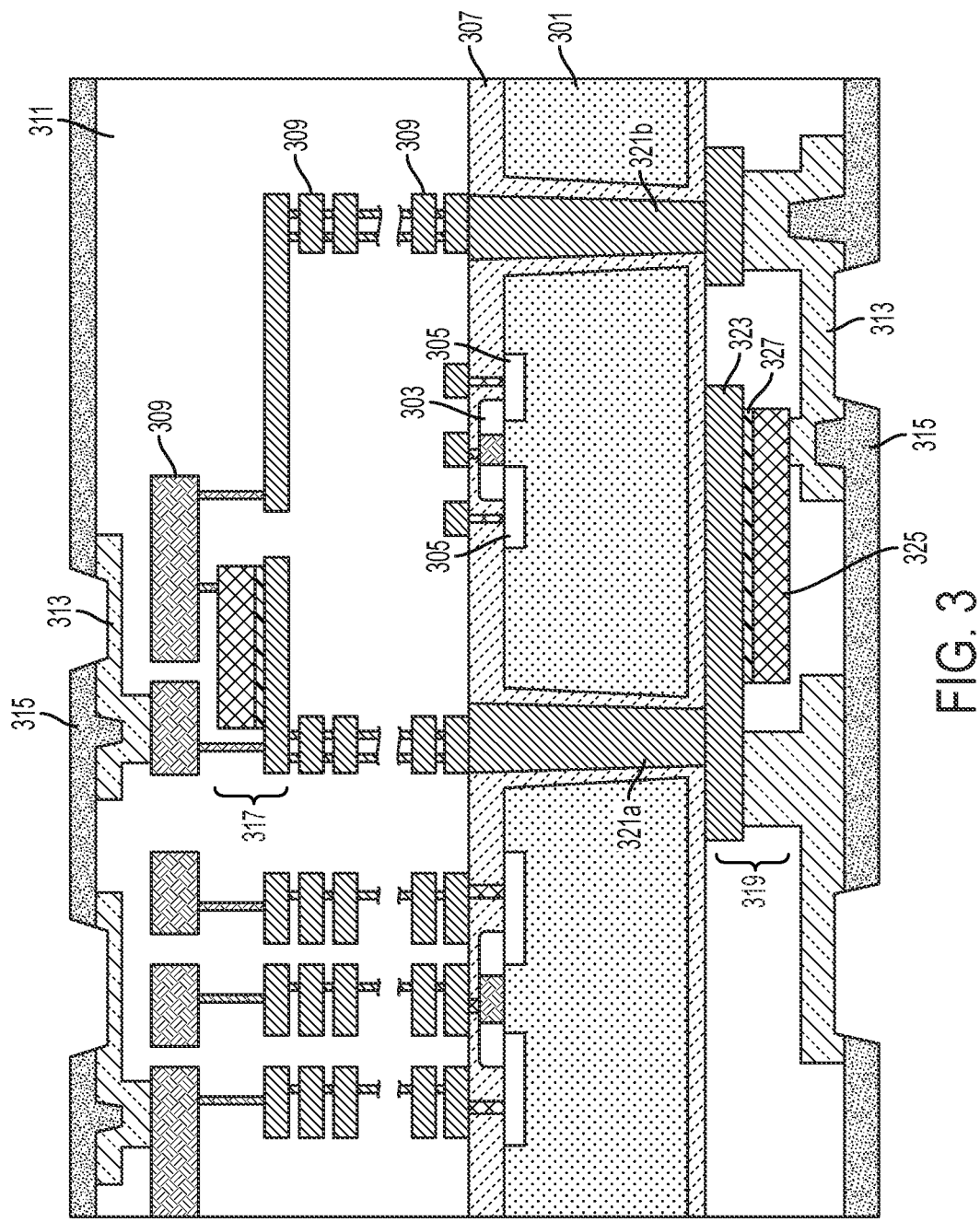
FIG. 3 schematically illustrates a structure with a back-side MIM capacitor, in accordance with an embodiment of the present disclosure.

FIG. 3 schematically illustrates a structure with a back-side MIM capacitor, in accordance with an embodiment of the present disclosure. The structure shown in FIG. 3 includes substrate 301, gate stack regions 303, source/drain regions 305, isolation dielectric 307, interconnect layers 309, inter-metal dielectric 311, bond pads 313, and passivation layers 315. As illustrated, the structure may also include a front-side MIM capacitor 317 and a back-side MIM capacitor 319 that are electrically connected by TSVs 321. As depicted, the back-side MIM capacitor may include a first plate 323, a second plate 325, and a dielectric layer 327 between the first and second plates 323 and 325.

Similar to the structure in FIG. 1, TSVs may be included that are not connected to the back-side MIM capacitor 319, for instance, to be utilized for other purposes of chip packaging or stacking. In some embodiments, the back-side MIM capacitor 319 may be electrically connected to other chips/circuits through 3D packaging for use by the other chips/circuits. Moreover, since there is more available back-side chip area that can be designated for back-side MIM capacitors, a larger capacitor may be formed without increasing the chip size. As shown, the back-side MIM capacitor 319 includes the first plate 323, the second plate 325, and the dielectric layer 327 which are several, tens, hundreds or more times greater (e.g., in length, width, thickness, etc.) than the corresponding plates and dielectric layer of the front-side MIM capacitor 317. Backside MIM capacitor 319, thus, may enable improved breakdown voltage and leakage performance, resulting in overall circuit performance improvement. Furthermore, since the MIM capacitor 319 is on the back side of the substrate 301, formation of the back-side MIM capacitor 319 may, for instance, be separated from other FEOL and BEOL processes.

Figure 4:
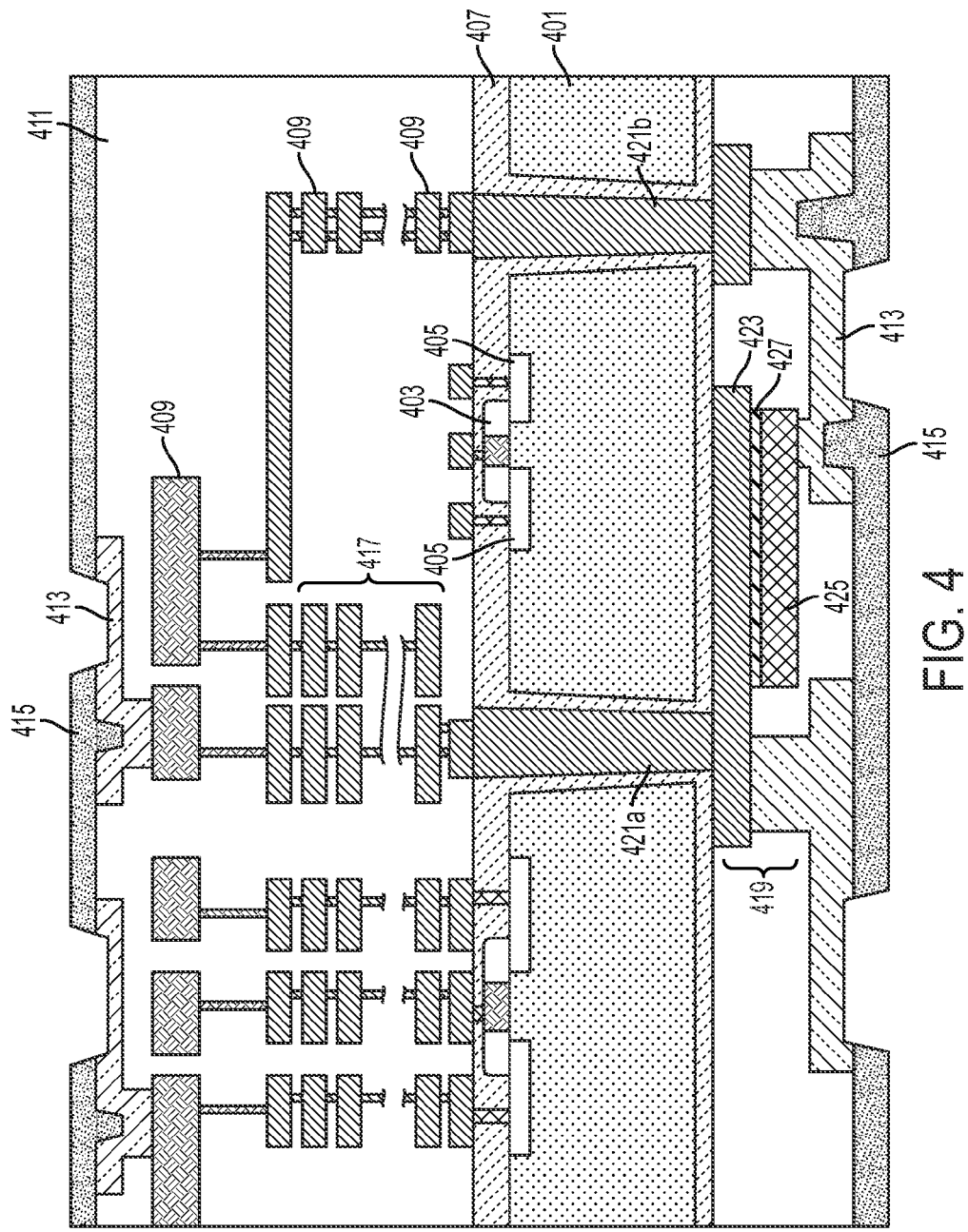
FIG. 4 schematically illustrates another structure with a back-side MIM capacitor, in accordance with an embodiment of the present disclosure.

FIG. 4 schematically illustrates another structure with a back-side MIM capacitor, in accordance with an embodiment of the present disclosure. The structure shown in FIG. 4 includes substrate 401, gate stack regions 403, source/drain regions 405, isolation dielectric 407, interconnect layers 409, inter-metal dielectric 411, bond pads 413, and passivation layers 415. As illustrated, the structure may also include a front-side MOM capacitor 417 and a back-side MIM capacitor 419 that are electrically connected by TSVs 421. As depicted, the back-side MIM capacitor may include a first plate 423, a second plate 425, and a dielectric layer 427 between the first and second plates 423 and 425, wherein the first plate 423 has a larger area than that that of the second plate 425. The structure in FIG. 4 may, for instance, include the advantages as described above with respect to the structure in FIG. 3.

The embodiments of the present disclosure can achieve several technical effects, including reduced chip size, lower manufacturing costs, decreased leakage, and increased reliability of devices with MOMs and/or MIMs. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a substrate having a front side and a back side that is opposite the front side, the substrate including circuitry on the front side of the substrate; and
    forming a metal-oxide-metal (MOM) capacitor, a metal-insulator-metal (MIM) capacitor, or a combination thereof, on the back side of the substrate;
    wherein the circuitry on the front side of the substrate includes a front-side MOM capacitor, a front-side MIM capacitor, or a combination thereof; each of the front-side and back-side capacitors comprising a plurality of layers, and wherein dimensions of each layer of the back-side capacitors are substantially greater than dimensions of each layer of the front-side capacitors.

2. The method according to claim 1, comprising forming a through-silicon via (TSV), in the substrate, connecting the back-side MOM capacitor, the back-side MIM capacitor, or a back-side combination thereof, to the circuitry on the front side of the substrate.

3. The method according to claim 1, comprising forming the back-side MOM capacitor by forming a plurality of parallel fingers.

4. The method according to claim 3, comprising forming the parallel fingers by forming a plurality of ultra thick metal (UTM) fingers.

5. The method according to claim 1, comprising forming the back-side MOM capacitor by: forming a first layer, including a first set of parallel fingers, on the back side of the substrate; and
    forming one or more other layers, including one or more other sets of parallel fingers, under the first layer on the back side of the substrate.

6. The method according to claim 1, comprising forming the back-side MOM capacitor by forming a layer including a first set of interconnected fingers and a second set of interconnected fingers, interlaced therewith.

7. The method according to claim 1, comprising forming the back-side MIM capacitor by forming a first plate, a second plate, and a dielectric layer between the first plate and the second plate.

8. A device comprising:
    a substrate having a front side and a back side that is opposite the front side;
    circuitry on the front side of the substrate; and
    a metal-oxide-metal (MOM) capacitor, a metal-insulator-metal (MIM) capacitor, or a combination thereof, on the back side of the substrate;
    wherein the circuitry on the front side of the substrate includes a front-side MOM capacitor, a front-side MIM capacitor, or a combination thereof; each of the front-side and back-side capacitors comprising a plurality of layers, and wherein dimensions of each layer of the back-side capacitors are substantially greater than dimensions of each layer of the front-side capacitors.

9. The device according to claim 8, comprising: a through-silicon via (TSV), in the substrate, connecting the back-side MOM capacitor, the back-side MIM capacitor, or a back-side combination thereof to the circuitry on the front side of the substrate.

10. The device according to claim 8, wherein the back-side MOM capacitor includes a plurality of parallel fingers.

11. The device according to claim 10, wherein the parallel fingers include a plurality of ultra thick metal (UTM) fingers.

12. The device according to claim 8, wherein the back-side MOM capacitor comprises: a first layer, including a first set of parallel fingers, on the back side of the substrate; and one or more other layers, including one or more other sets of parallel fingers, under the first layer on the back side of the substrate.

13. The device according to claim 8, wherein the back-side MOM capacitor comprises a layer including a first set of interconnected fingers and a second set of interconnected fingers, interlaced therewith.

14. The device according to claim 8, wherein the back-side MIM capacitor includes a first plate, a second plate, and a dielectric layer between the first plate and the second plate.

15. A method comprising:
    forming a substrate having a front side and a back side that is opposite the front side; forming circuitry on the front side of the substrate; forming a through-silicon via (TSV), in the substrate, electrically connected to the circuitry on the front side of the substrate; and
    forming a metal-oxide-metal (MOM) capacitor, a metal-insulator-metal (MIM) capacitor, or a combination thereof, on the back side of the substrate, electrically connected to the TSV;
    wherein the circuitry on the front side of the substrate includes a front-side MOM capacitor, a front-side MIM capacitor, or a combination thereof; each of the front-side and back-side capacitors comprising a plurality of layers, and wherein dimensions of each layer of the back-side capacitors are substantially greater than dimensions of each layer of the from-side capacitors.

16. The method according to claim 15, further comprising:
    forming the back-side MOM capacitor by forming at least one layer, each layer including a plurality of parallel fingers, on the back side of the substrate.

17. The method according to claim 15, further comprising:
    forming the back-side MIM capacitor by forming a first plate, a second plate, and a dielectric layer between the first plate and the second plate.

18. The method according to claim 15, comprising packaging the MOM capacitors, the MIM capacitors, or a combination thereof with other circuitry, devices, or a combination thereof, using standard chip stack/package technology.

* * * * *